United States Patent
Romas, Jr. et al.

(10) Patent No.: US 9,391,055 B2
(45) Date of Patent: Jul. 12, 2016

(54) POWER MODULE HAVING STACKED SUBSTRATES ARRANGED TO PROVIDE TIGHTLY-COUPLED SOURCE AND RETURN CURRENT PATHS

(71) Applicant: LOCKHEED MARTIN CORPORATION, Bethesda, MD (US)

(72) Inventors: Gregory George Romas, Jr., Coppell, TX (US); David L. Hoelscher, Arlington, TX (US); Thomas Eugene Byrd, Grand Prairie, TX (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 117 days.

(21) Appl. No.: 14/094,977

(22) Filed: Dec. 3, 2013

(65) Prior Publication Data
US 2014/0152373 A1 Jun. 5, 2014

Related U.S. Application Data

(60) Provisional application No. 61/733,631, filed on Dec. 5, 2012.

(51) Int. Cl.
*H03K 17/04* (2006.01)
*H01L 25/18* (2006.01)
*H01L 25/07* (2006.01)
*H01L 23/00* (2006.01)

(52) U.S. Cl.
CPC ............... *H01L 25/18* (2013.01); *H01L 24/48* (2013.01); *H01L 25/072* (2013.01); *H01L 2224/48137* (2013.01); *H01L 2224/48229* (2013.01); *H01L 2224/49174* (2013.01); *H01L 2924/1305* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| 7,042,086 B2 | 5/2006 | Shimoida et al. |
| 7,256,489 B2 | 8/2007 | Ishikawa et al. |
| 8,076,696 B2 | 12/2011 | Beaupre et al. |
| 2009/0039498 A1* | 2/2009 | Bayerer ........................ 257/700 |

(Continued)

OTHER PUBLICATIONS

Shinohara, "A Novel Low-Profile Power Module Aimed at High-Frequency Applications", pp. 321-324, ©1996 IEEE.

*Primary Examiner* — Cassandra Cox
(74) *Attorney, Agent, or Firm* — Terry M. Sanks, Esq.; Beusse Wolter Sanks & Maire, PLLC (57) ABSTRACT

Power modules with reduced parasitic inductances are provided. A power module includes a first substrate including a first electrically-conductive layer and a second substrate including a second electrically-conductive layer. These substrates may be stacked on each other. A scalable network of power switches may be arranged on the substrates. Power bars may be connectable to the electrically-conductive layers through electromechanical interfaces at selectable interface locations. The locations and/or type of interface may be selectable based on the arrangement of the switches. The first and second electrically-conductive layers may be disposed on mutually opposed surfaces of a dielectric layer having a thickness chosen to effect a level of coupling between respective source and return current paths provided by the electrically-conductive layers. The level of coupling may be arranged to increase the mutual inductance within the power module, which can effectively reduce the formation of parasitic inductance in the power module.

21 Claims, 4 Drawing Sheets

(56) References Cited

U.S. PATENT DOCUMENTS

| | | | |
|---|---|---|---|
| 2009/0129028 A1* | 5/2009 | Son et al. | 361/715 |
| 2010/0237507 A1* | 9/2010 | Yamada et al. | 257/773 |
| 2011/0242770 A1* | 10/2011 | Yamanaka et al. | 361/728 |
| 2013/0200849 A1* | 8/2013 | Crebier et al. | 320/116 |

* cited by examiner

POWER MODULE HAVING STACKED SUBSTRATES ARRANGED TO PROVIDE TIGHTLY-COUPLED SOURCE AND RETURN CURRENT PATHS

CROSS-REFERENCE TO RELATED APPLICATIONS

This application claims the benefit of U.S. Provisional Application No. 61/733,631, filed Dec. 5, 2012, and incorporated herein by reference in its entirety.

BACKGROUND

Embodiments relate generally to power modules, and, more particularly, to power modules with reduced parasitic inductance.

Power semiconductor modules, or simply power modules, may be used for the conversion of electric power and/or power conditioning through use of power semiconductor switches that may be switched at relatively fast switching speeds between a conductive and a non-conductive state in response to switching control signals to perform a desired power conversion or power conditioning functionality. Example applications may include, inverter applications for converting direct current (DC) power to alternating current (AC) power, rectification applications for converting AC to DC power, voltage conversion applications for converting DC power from one voltage to another, and frequency conversion applications for converting AC power from one oscillation frequency to another. Notwithstanding of advances which have been made in this field, parasitic effects, such as parasitic inductance, that can arise within known power modules can limit both the switching speed and the peak currents that can be handled by such power modules. This can potentially lead to reduced reliability due to greater over-current and/or over-voltage stresses that may be endured by the involved power semiconductor devices. Thus, there continues to be a need for power modules with reduced parasitic inductance.

SUMMARY

Embodiments relate to power modules having reduced parasitic inductances. In one example embodiment, a power module may include a first substrate comprising at least a first electrically-conductive layer. The power module may further include a second substrate comprising at least a second electrically-conductive layer. The first and second substrates may be stacked on each other. A scalable network of power semiconductor switches may be arranged on at least one of the first and second substrates. A first power bar and a second power bar are respectively connectable to the first and second electrically-conductive layers through respective electromechanical interfaces arranged at selectable interface locations along the first and second electrically-conductive layers. The interface locations and/or type of interface may be selectable based on the arrangement of the scalable network of power semiconductor switches. The first and second electrically-conductive layers may be disposed on mutually opposed surfaces of a dielectric layer having a thickness chosen to effect a level of coupling between respective source and return current paths provided by the first and second electrically-conductive layers. The level of coupling arranged to increase the mutual inductance within the power module.

In one example embodiment, such as may be used for a drive comprising a half-bridge architecture, a first power semiconductor switch may be disposed on the first substrate and may have a respective source current path at least in part constituted by the first electrically-conductive layer. The first power semiconductor switch may have a respective return current path at least in part being constituted by the second electrically-conductive layer. A second power semiconductor switch may be disposed on the first substrate and may have a respective return current path at least in part being constituted by another second conductive layer in the second substrate. The second power semiconductor switch may have a respective source current path at least in part being constituted by another first electrically-conductive layer in the first substrate.

In another example embodiment, such as may be used for a bi-directional blocking switch, a first power semiconductor switch may be disposed on the second substrate and may have a respective source current path at least in part being constituted by the second electrically-conductive layer. A second power semiconductor switch may be disposed on the first substrate and may have a respective return current path at least in part being constituted by the first electrically-conductive layer.

BRIEF DESCRIPTION OF THE DRAWINGS

Embodiments may be explained in the following description in view of the drawings that show.

DETAILED DESCRIPTION

The present inventors have cleverly recognized certain limitations in connection with known power modules that may rely on conductors, such as bond wires, which may be separated by an air gap and which may be generally disposed in a two-dimensional configuration for carrying source and return currents. These power modules tend to suffer from relatively high-levels of inductance. For example, parasitic inductances associated with such power modules can limit both the switching speed and the peak currents that may be achieved. In view of such recognition, the present inventors propose an innovative and versatile stacked substrate arrangement for reliably and cost-effectively reducing parasitic inductance in power modules.

In the following detailed description, various specific details are set forth in order to provide a thorough understanding of depicted embodiments. However, those skilled in the art will understand that such embodiments may be practiced without these specific details, that the depicted embodiments are non-limiting embodiments, and that alternative embodiments may be implemented. In other instances, methods, procedures, and components, which would be well-understood by one skilled in the art have not been described in detail to avoid unnecessary and burdensome explanation.

Furthermore, various operations may be described as multiple discrete steps performed in a manner that is helpful for understanding embodiments. However, the order of description should not be construed as to imply that these operations need be performed in the order they are presented, nor that they are even order dependent unless otherwise so described. Moreover, repeated usage of the phrase "in one embodiment" does not necessarily refer to the same embodiment, although it may. Moreover, unless specifically stated, any use of the terms first, second, etc., does not denote any order or importance, but rather the terms first, second, etc., are used to distinguish one element from another. Lastly, the terms "comprising", "including", "having", and the like, as used in the present application, are intended to be synonymous unless otherwise so indicated.

Figure 1:
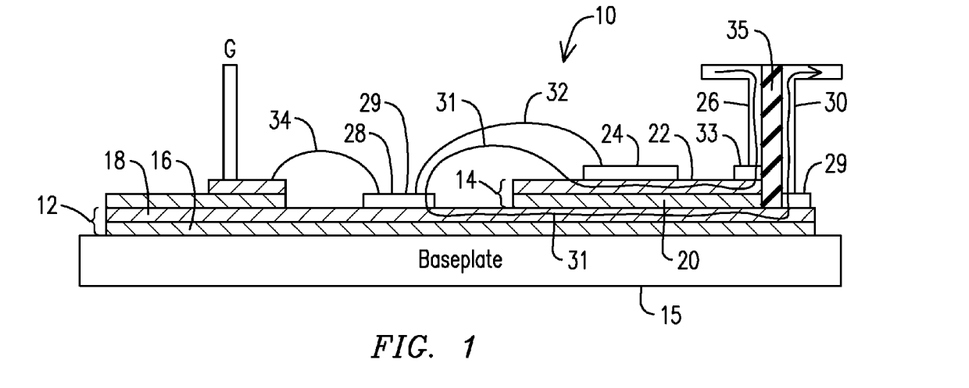
FIG. 1 shows a cross-sectional view of a disclosed power module according to an example embodiment.

FIG. 1 is a cross-sectional view of a disclosed power module 10, which in one example embodiment may comprise a first (e.g., a bottom) substrate 12, and a second (e.g., a top) substrate 14. In one example embodiment, first and second substrates 12, 14 may comprise respective direct bonded copper (DBC) substrates, which may be arranged in stacking relationship with one another. For example, top substrate 14 may be superposed, at least on a portion of bottom substrate 12. Although disclosed embodiments will be described in terms of two stacked substrates, it will be appreciated that example embodiments may include more than two stacked substrates. Moreover, it will be appreciated by those skilled in the art that in general any direct bonded metallization (DBM) substrate or analogous structures, such as those formed by a co-fired ceramic processing, may be used as alternatives. Bottom substrate 12 may be physically attached to a baseplate 15. In a typical application, baseplate 15 in turn may be attached to a heat sink/heat exchanger (not shown).

First substrate 12 may comprise a dielectric layer 16 and a first electrically-conductive layer 18 disposed on a top surface of dielectric layer 16. Second substrate 14 may similarly comprise a dielectric layer 20 and a second electrically-conductive layer 22 disposed on a top surface of dielectric layer 20. In one example embodiment, dielectric layers 16, 20 may each comprise ceramic tiles suitable to provide electrical insulation and thermal conductivity. In one example embodiment, electrically-conductive layers 18, 22 may each comprise respective patterned layers of copper or another suitable conductive material. Top and bottom substrates 12, 14 may be joined to one another using affixing techniques well-known to those skilled in the art, such as soldering, sintering, brazing, or ultrasonic welding, for example.

In one example embodiment, a scalable network of power semiconductor switches may be arranged on at least one of the first and second substrates 12, 14. For example, a first power semiconductor switch 24 may be disposed on second substrate 14 and may have its drain terminal electrically connected by way of second electrically-conductive layer 22 in second substrate 14 to a first power bar 26 (e.g., a positive side of a direct-current (DC) bus). See FIG. 5 for a circuit schematic of the embodiment illustrated in FIG. 1.

A second power semiconductor switch 28 may be disposed on first substrate 12 and may have its drain terminal electrically connected by way of first electrically-conductive layer 18 in first substrate 12 to a second power bar 30 (e.g., the negative side of the DC bus). That is, in this example embodiment power semiconductor switches 24, 28 may have their respective drain terminals—at locations at their bottom surfaces—electrically connected to electrically-conductive layers 22, 18. That is, in one example embodiment, power semiconductor switches 24, 28 may comprise a vertically-extending layout. It is noted that disclosed power modules may alternatively comprise power semiconductor switches having a laterally-extending layout.

Figure 7:
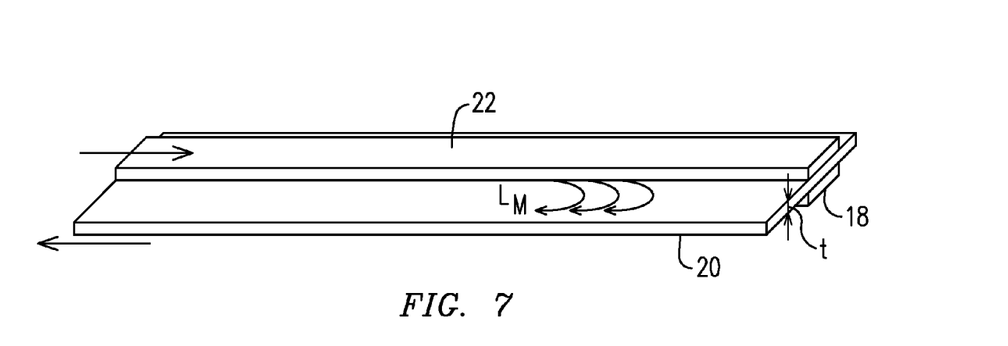
FIG. 7 is a schematic for conceptualizing induction reduction aspects of a disclosed power module.
Figure 8:
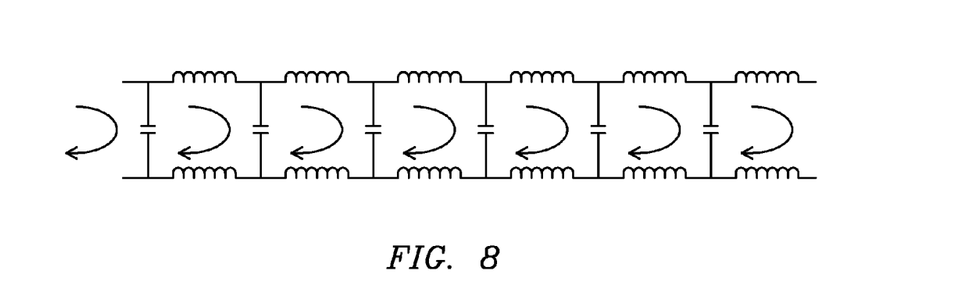
FIG. 8 is an equivalent circuit for the schematic shown in FIG. 7.

Respective current paths, such as source and return current paths, that are provided by electrically-conductive layers 18, 22 contribute to form a loop (conceptually represented by line 31) so that current flow in first electrically-conductive layer 18 (e.g., return current) flows in an opposite direction relative to current flow (e.g., source current) of the same magnitude in second electrically-conductive layer 22. As may be conceptually appreciated from the schematic shown in FIG. 7, and the equivalent circuit shown in FIG. 8, this three-dimensional (3-D) stacking arrangement of substrates can provide tightly coupled source-return (e.g., input power-return) current paths and increase the mutual inductance within the power module.

This tight coupling primarily is determined by the thickness of the dielectric (e.g., dielectric layer 20) which is interposed between electrically-conductive layers 18, 22. In one example embodiment, the thickness of dielectric layer 20 may be chosen to effect a level of coupling (e.g., magnetic coupling) between the respective source and return current paths provided by the first and second electrically-conductive layers 18, 22. This level of coupling may be arranged to increase the mutual inductance within the power module As will be appreciated by those skilled in the art, the increase of the mutual inductance $L_M$ (e.g., series mutual inductance) that develops between first and second electrically-conductive layers 18, 22 is effective to reduce the total loop inductance by cancellation of partial inductances. For example, magnetic flux from electrically-conductive layer 18 may be generally formed in an opposite direction and practically of the same magnitude relative to the magnetic flux from electrically-conductive layer 22, thus effectively offsetting one another, and providing a reduction in the total loop inductance.

The thickness of dielectric layer 20 between first electrically-conductive layer 18 and second electrically-conductive layer 22 may be chosen to be sufficiently narrow (e.g., ranging from approximately 10 microns to approximately 5 millimeters) so that current flow in opposite directions and of the same magnitude in such 3-D stacked layers results in a substantially lower parasitic inductance as compared to conventional two-dimensionally arranged current paths. As will be appreciated by those skilled in the art, the thickness of dielectric layer 20 would be chosen to be sufficiently wide consistent with the voltage/current levels expected between electrically-conductive layers 18, 22. It will be appreciated that such a tight coupling becomes particularly beneficial in operational situations involving relatively high switching frequencies for the power semiconductor switches. Thus, thorough evaluation of influencing factors, such as the electrical properties of the dielectric material involved, should be made to obtain a maximal benefit for such example applications. Additionally, tradeoffs, such as may involve thermal management within the power module, may be considered in connection with the thickness of dielectric layer 20.

This stacking arrangement of substrates and concomitant reduction of parasitic inductance may, without limitation, be particularly attractive in embodiments where the involved power semiconductor components, such as power switches, diodes, etc., may be formed of a respective high-temperature, wide bandgap semiconductor material, such as silicon carbide, gallium nitride and aluminum nitride. As will be appreciated by those skilled in the art, this type of power semiconductor components has the ability to handle relatively higher current and voltages with lower switching losses compared to silicon-based power semiconductor components.

Figure 1A:
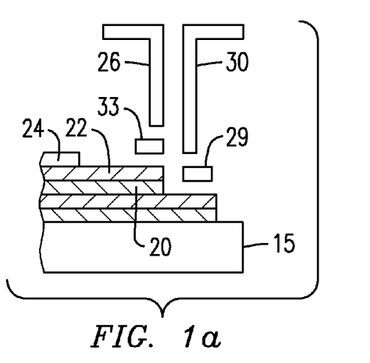
FIG. 1a is an exploded view regarding example electromechanical interfaces for power bars of the power module that may be arranged at selectable interface locations of the power module.

As further illustrated in FIG. 1, a bond wire 32 may be used to electrically interconnect the respective source terminals of power switches 24, 28. Gate connections for applying switching control signals to power switches 24, 28 may be made via further wire bonds. For example, a bond wire 34 may be used to connect a high-side of a switching control signal (G) to the gating terminal of power switch 28. For simplicity of illustration, the low-side of such switching control signal or gating connections for power switch 24 are not shown. Power bars 26, 30 may be respectively connectable to first and second electrically-conductive layers 22, 18 through respective electromechanical interfaces 33, 29 arranged at selectable interface locations along the first and second electrically-conductive layers 22, 18. FIG. 1a is an exploded view regarding electromechanical interfaces 33, 29 prior to being connected to first and second electrically-conductive layers 22, 18 at selectable interface locations.

In one example embodiment, the interface locations and/or type of interface may be selectable based on the arrangement of the scalable network of power semiconductor switches. This provides substantial versatility to users of the power module since this allows for use of a scalable network of power semiconductor switches that may be adaptable to meet the power needs of a given application while providing a user-friendly interface in the power module notwithstanding of a relatively large number of power switches that may be provided in the power module. For example, the type of interface connections may comprise relatively flexible interface connections, as may be provided by electromechanical interfaces, such as bond wires, springs, etc. Alternatively, the type of interface connections may comprise relatively rigid interface connections, as may be provided by electromechanical interfaces, such as solder interface joints, sinter interface joints, etc.

Power bars 26, 30 may be arranged sufficiently proximate to one another to establish a tight coupling between the respective current flows passing through power bars 26, 30 and further increase the mutual inductance within the power module. A creepage barrier 35 may be disposed between power bars 26, 30 to avoid the possibility of electrical arcing between one another. This tight coupling arrangement of the power bars may further contribute to reduce the loop inductance of the overall circuit defined by the power bars and the electrically-conductive layers within the power module.

Figure 2:
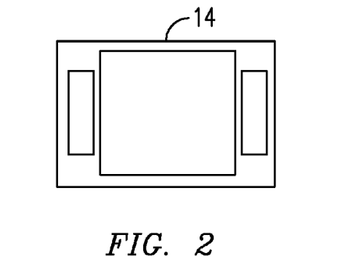
FIG. 2 is a top view of a top substrate, such as direct bonded copper (DBC) substrate, which may be part of the power module shown in FIG. 1.
Figure 3:
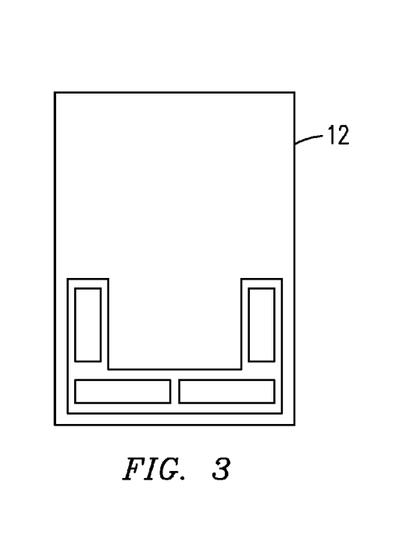
FIG. 3 is a top view of a bottom DBC substrate, which may also be part of the power module shown in FIG. 1.
Figure 4:
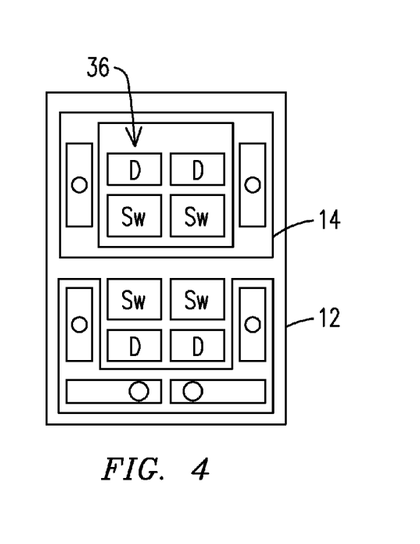
FIG. 4 is a top view of top and bottom DBC substrates stacked to form a power module comprising a transistor cell, such as may be made up of four power semiconductor switches.

FIG. 2 is a top view of top substrate 14, and FIG. 3 is a top view of bottom substrate 12. FIG. 4 is a top view of top and bottom substrates 12, 14, which may be stacked on one another to form a power module comprising one or more transistor cells 36 made up of four power semiconductor switches and optional diodes respectively labeled SW and D.

Figure 5:
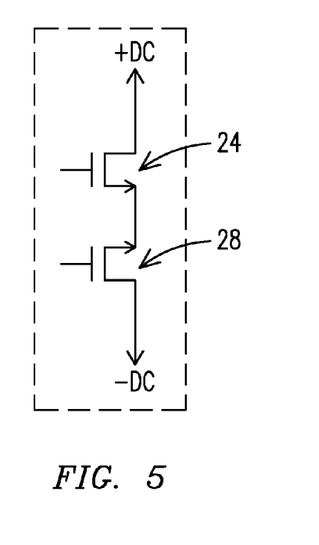
FIG. 5 is a circuit schematic of the power module shown in FIG. 1.
Figure 6:
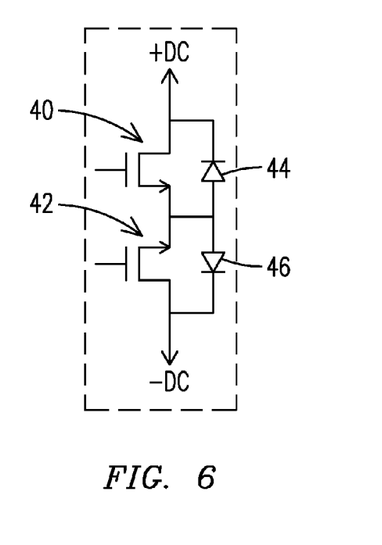
FIG. 6 is a circuit schematic which optionally includes diode components for the power module.

FIG. 5 is a circuit schematic of the power module section illustrated in FIG. 1. As will be appreciated by those skilled in the art, this circuit embodies a power module comprising a bi-directional blocking switch. This circuit should be construed as one non-limiting example of a disclosed power module. As suggested above, depending on the type of power semiconductor switches that may be used in a given power module, such as Insulated-Gate Bipolar Transistor (IGBT) switches, Metal Oxide Semiconductor Field Effect Transistor (MOSFET) switches, etc., and/or the needs of a given application, circuitry comprising diode components may be optionally added to the power module circuitry. For example, as shown in FIG. 6, power switches 40, 42 respectively include optional diodes 44, 46. In this example, diode 44 has its cathode connected to the drain terminal of power semiconductor switch 40 and its anode connected to the source terminal of power semiconductor switch 40. Diode 46 has its cathode connected to the drain terminal of power semiconductor switch 42 and its anode connected to the source terminal of power semiconductor switch 42.

Figure 9:
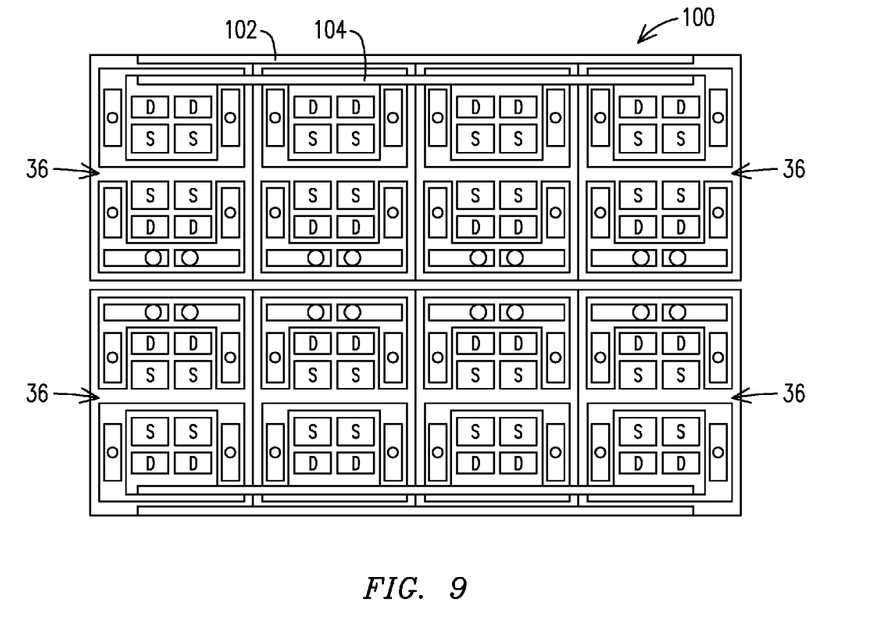
FIG. 9 is a top view for conceptualizing scalability aspects of a disclosed power module according to an example embodiment.

FIG. 9 is a top view for conceptualizing scalability aspects of a disclosed power module 100 according to one example embodiment, such as an array of transistor cells 36 comprising eight transistor cells. In one example embodiment, a number of transistor cells may be interconnected in parallel-circuit through power bars 102, 104. It will be appreciated that series-circuit implementations or implementations involving series and parallel-circuit combinations may be readily implemented.

Figure 10:
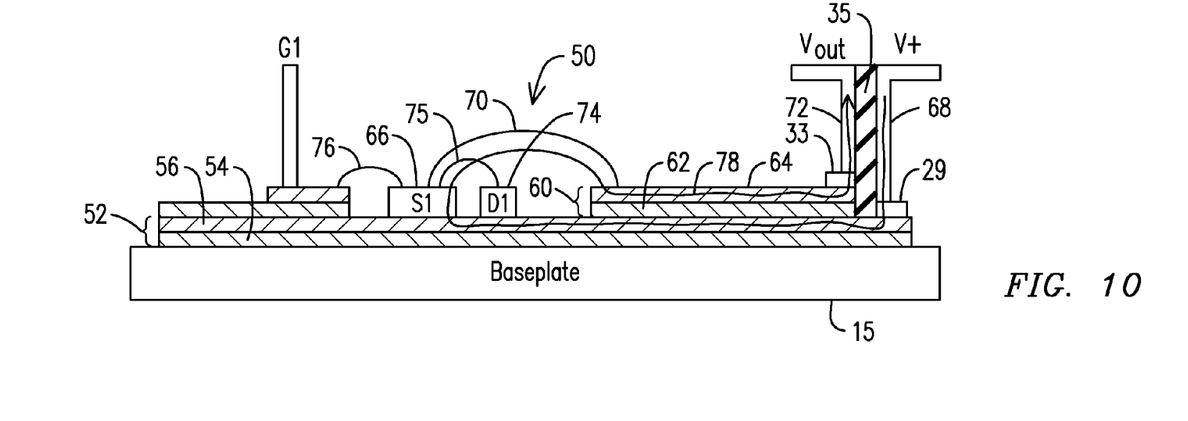
FIG. 10 shows a cross-sectional view of a building block that may be used to construct a power module comprising a half-bridge architecture according to an example embodiment.

FIG. 10 is a cross-sectional view of a building block 50 that may be used to construct a power module comprising a half-bridge architecture according to another example embodiment. A first substrate 52 (e.g., a bottom substrate) comprises a dielectric layer 54 and a first electrically-conductive layer 56 disposed on a top surface of dielectric layer 54. A second substrate 60 (e.g., a top substrate) comprises a dielectric layer 62 and a first electrically-conductive layer 64 disposed on a top surface of dielectric layer 62. Once again, first and sub-strates 52, 60 may comprise respective DBC substrates.

In this example embodiment, a power semiconductor switch 66 may have its drain terminal electrically connected by way of the first electrically-conductive layer 56 in first substrate 52 to a first power bar 68 (e.g., a positive side of a DC bus, labeled V+). Power semiconductor switch 66 may have its source terminal (S1) electrically connected by way of a bond wire 70 and the second electrically conductive layer 64 in second substrate 60 to a second power bar 72 (e.g., labeled Vout). FIG. 10 further illustrates a diode 74 optionally interconnected between the drain and source terminals of power semiconductor switch 66. For example, a bonding wire 75 may connect the anode terminal of diode 74 to the source terminal of power switch 66. The drain terminal of power semiconductor switch 66 may be electrically connected to the cathode of diode 74 by way of first electrically-conductive layer 56 in first substrate 52 A bonding wire 76 may be connected to a gating terminal of power semiconductor switch 66 to apply a switching control signal (G1) to power semiconductor switch 66. In this example embodiment, power semiconductor switch 66 comprises a vertically-extending layout. As noted above, disclosed power modules may alternatively comprise power semiconductor switches having a laterally-extending layout.

In this example embodiment, respective current paths provided by electrically conductive layers 56, 64 contribute to form a loop (conceptually represented by line 78) so that when power semiconductor switch 66 is in a conducting state, current flow in first conductive layer 56 (e.g., source current) flows in an opposite direction relative to a current flow (e.g., return current) of the same magnitude in second conductive layer 64. Because of the tight coupling which is established between electrically-conductive layers 56, 64, this results in a reduction in the series mutual inductance between conductive layers 56, 64, which effectively reduces the formation of parasitic inductance in the power module. This tight coupling is primarily determined by the thickness of the dielectric (e.g., dielectric layer 62) which is interposed between electrically-conductive layers 56, 64.

Figure 11:
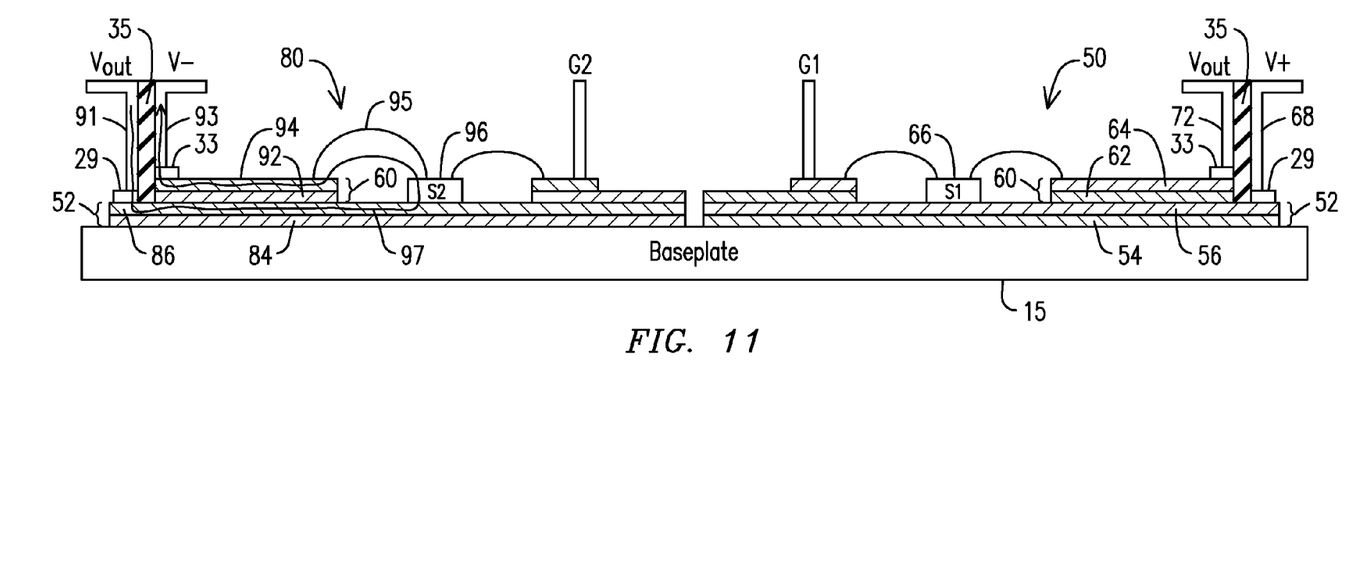
FIG. 11 is a cross-sectional view of two building blocks, which in combination form a power module having the half-bridge architecture.
Figure 12:
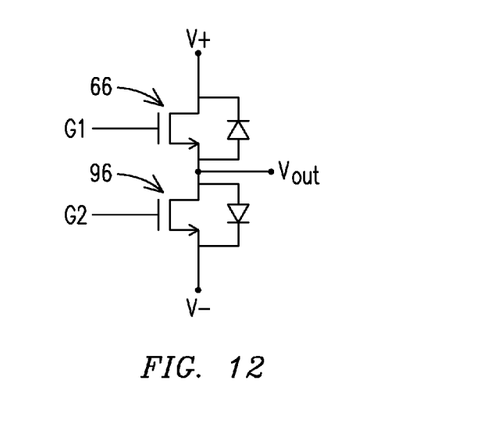
FIG. 12 is a circuit schematic of half-bridge power module.

FIG. 11 is a cross-sectional view of two building blocks 50, 80 which in combination form a disclosed power module, such as a drive comprising a half-bridge architecture. See circuit schematic shown in FIG. 12. For simplicity of illustration, FIG. 11 omits the diodes shown in FIG. 12. The construction and operation of building block 50 was described above and will not be repeated here. In building block 80, first substrate 52 (e.g., the bottom substrate) further includes another first electrically-conductive layer 86 disposed on a top surface of a dielectric layer 84. Second substrate 60 (e.g., the top substrate) further includes another second electrically-conductive layer 94 disposed on a top surface of a dielectric layer 92. It will be appreciated that although electrically-conductive layer 56 and electrically-conductive layer 86 may each be disposed in first substrate 52; such layers are not electrically-connected to one another. Similarly, electrically-conductive layer 64 and electrically-conductive layer 94 in second substrate 52 are not electrically connected to one another.

In this example embodiment, a second power semiconductor switch 96 may have its drain terminal electrically connected by way of electrically-conductive layer 86 in first substrate 52 to a third power bar 91 (e.g., labeled Vout). Power semiconductor switch 96 may have its source terminal (S2) electrically connected by way of a bond wire 95 and electrically conductive layer 94 in second substrate 60 to a fourth power bar 93 (e.g., a negative side of a DC bus, labeled V−). First and second power bars 68, 72 (also third and fourth power bars 91, 93) may be respectively arranged sufficiently proximate to one another to establish a tight coupling between the respective current flows passing through corresponding power bar pairs. Creepage barrier 35 may be respectively disposed between corresponding power bars to avoid the possibility of electrical arcing between one another. First and third power bars 72, 91 may be connected to supply electrical power to respective electrical sides of a load, such as a motor, etc., (not shown).

In this case, respective current paths provided by electrically-conductive layers 86, 94 in building block 80 are arranged to form a loop (conceptually represented by line 97) so that when power semiconductor switch 96 in building block 80 is in a conducting state, current flow in first conductive layer 86 flows in an opposite direction relative to a current flow of the same magnitude in second conductive layer 94, and because of the tight coupling which is established between electrically-conductive layers 86, 94, this results in a reduction in the series mutual inductance between conductive layers 86, 94, which further reduces the formation of parasitic inductance in the power module. In this case, this tight coupling is primarily determined by the thickness of the dielectric (e.g., dielectric layer 92) which is interposed between electrically-conductive layers 86, 94.

It is noted that the stacking construction illustrated for the power module embodiment shown in FIG. 1, involves two-levels of dielectric layering for power switch 24. By way of comparison, the stacking construction illustrated for the power module embodiment illustrated in FIG. 11, involves just one-level of dielectric layering for both power switches 66, 96, which can result in enhanced thermal performance. Thus, tradeoffs may be considered while implementing a given power module topology.

While the preceding disclosure has made reference to various embodiments, it will be apparent that such embodiments are provided by way of example only. Those skilled in the art will appreciate that various changes, omissions and/or additions may be without departing from the embodied concepts. Therefore, it is intended that the embodied concepts not be limited to any particular embodiment, but only by the spirit and scope of the appended claims.

We claim:

1. A power module comprising:
    a first substrate comprising at least a first electrically-conductive layer;
    a second substrate comprising at least a second electrically-conductive layer, the first and second substrates being stacked on each other;
    a scalable network of power semiconductor switches arranged on at least one of the first and second substrates; and
    a first power bar and a second power bar, wherein the first power bar and the second power bar are respectively connectable to the first and second electrically-conductive layers through respective electromechanical interfaces arranged at selectable interface locations along the first and second electrically-conductive layers, the interface locations and/or type of interface being selectable based on the arrangement of the scalable network of power semiconductor switches,
    wherein the first and second electrically-conductive layers are disposed on mutually opposed surfaces of a dielectric layer having a thickness chosen to effect a level of coupling between respective source and return current paths provided by the first and second electrically-conductive layers, the level of coupling arranged to increase the mutual inductance within said power module.

2. The power module of claim 1, wherein the scalable network of power semiconductor switches comprises a first power semiconductor switch disposed on the second substrate and having a respective source current path at least in part being constituted by said at least second electrically-conductive layer.

3. The power module of claim 2, wherein the scalable network of power semiconductor switches further comprises a second power semiconductor switch disposed on the first substrate and having a respective return current path at least in part being constituted by said at least first electrically-conductive layer.

4. The power module of claim 3, further comprising a bond wire arranged to electrically interconnect to one another respective source terminals of said first and second power semiconductor switches.

5. The power module of claim 2, wherein the first and second power bars comprise a creepage barrier interposed between one another.

6. The power module of claim 3, further comprising a first diode having its cathode connected to a drain terminal of the first power semiconductor switch and its anode connected to a source terminal of the first power semiconductor switch, and a second diode having its cathode connected to a drain terminal of the second power semiconductor switch and its anode connected to a source terminal of the second power semiconductor switch.

7. The power module of claim 3, wherein the first and second power semiconductor switches comprise a respective high-temperature, wide bandgap semiconductor material.

8. The power module of claim 7, wherein the high-temperature, wide bandgap semiconductor material is selected from the group consisting of silicon carbide, gallium nitride and aluminum nitride semiconductor material.

9. The power module of claim 1, wherein the scalable network of power semiconductor switches comprises a first power semiconductor switch disposed on the first substrate and having a respective source current path at least in part constituted by said at least first electrically-conductive layer, the first power semiconductor switch having a respective return current path at least in part being constituted by said at least second electrically-conductive layer.

10. The power module of claim 1, wherein the scalable network of power semiconductor switches further comprises a second power semiconductor switch disposed on the first substrate and having a respective current return path at least in part being constituted by another second electrically-conductive layer in the second substrate, the second power semiconductor switch having a respective source current path at least in part being constituted by another first electrically-conductive layer in the first substrate.

11. The power module of claim 9, further comprising a first bond wire arranged to electrically connect a source terminal of said first power semiconductor switch to said at least second electrically-conductive layer in the second substrate.

12. The power module of claim 11, further comprising a second bond wire arranged to electrically connect a source terminal of said second power semiconductor switch to said another second electrically-conductive layer in the second substrate.

13. The power module of claim 12, wherein the first and second power bars comprise a creepage barrier interposed between one another.

14. The power module of claim 13, further comprising a third power bar connectable, through a respective electromechanical interface arranged at a selectable interface location, to said another first electrically-conductive layer in the first substrate, and a fourth power bar connectable, through a respective electromechanical interface arranged at a selectable interface location, to said another second electrically-conductive layer in the second substrate, the interface locations and/or type of interface being selectable based on the arrangement of the scalable network of power semiconductor switches, the third and fourth power bars comprising a creepage barrier interposed between one another, wherein the second power bar is arranged to receive a first voltage from a direct current (DC) link, wherein the fourth power bar is arranged to receive a second voltage from a direct current (DC) link, wherein the first and second voltages have opposite voltage polarity, wherein the first and fourth power bars are arranged to supply electrical power to respective sides of a load.

15. The power module of claim 12, further comprising a first diode having its cathode connected to a drain terminal of the first power semiconductor switch and its anode connected to a source terminal of the first power semiconductor switch, and a second diode having its cathode connected to a drain terminal of the second power semiconductor switch and its anode connected to a source terminal of the second power semiconductor switch.

16. The power module of claim 10, wherein the first and second power semiconductor switches comprise a respective high-temperature, wide bandgap semiconductor material.

17. The power module of claim 8, wherein the high-temperature, wide bandgap semiconductor material is selected from the group consisting of silicon carbide, gallium nitride and aluminum nitride semiconductor material.

18. A power module comprising:
a first substrate comprising at least a first electrically-conductive layer and a dielectric layer; and
a second substrate comprising at least a second electrically-conductive layer, the first substrate stacked on a portion of the second substrate,
wherein the first and second electrically-conductive layers are disposed on mutually opposed surfaces of the dielectric layer having a thickness chosen to effect a level of coupling between respective source and return current paths provided by the first and second electrically-conductive layers, the level of coupling arranged to increase the mutual inductance within said power module;
a baseplate having the second substrate stacked thereon:
a first power semiconductor switch disposed on the first substrate and having a respective source current path at least in part constituted by said at least first electrically-conductive layer, the first power semiconductor switch having a respective return current path at least in part being constituted by said at least second conductive layer; and
a second power semiconductor switch disposed on the first substrate and having a respective return current path at least in part being constituted by another second electrically-conductive layer in the second substrate, the second power semiconductor switch having a respective source current path at least in part being constituted by another first electrically-conductive layer in the first substrate.

19. A power module comprising:
a top substrate comprising at least a first electrically-conductive layer having a top surface and a bottom surface and a dielectric layer having a thickness between mutually opposing dielectric surfaces;
a bottom substrate comprising at least a second electrically-conductive layer having a top surface, the bottom substrate having a first portion and a second portion wherein the first portion is a different portion from the second portion, the top substrate being superposed on the top surface of the second electrically-conductive layer associated with the first portion such that the top substrate and the bottom substrate are affixed to one another;
a baseplate coupled to the bottom substrate;
a plurality of first power semiconductor switches disposed on the top surface of the second electrically-conductive layer associated with the second portion and having a respective source current path at least in part being constituted by said at least the second electrically-conductive layer; and
a plurality of second power semiconductor switches disposed on the top surface of the first electrically-conductive layer and having a respective return current path at least in part being constituted by said at least the first electrically-conductive layer;
wherein the bottom surface of the first electrically-conductive layer and the first portion of the top surface of the second electrically-conductive layer are affixed to the mutually opposed dielectric surfaces of the dielectric layer with the thickness chosen to effect a level of coupling between the respective source and return current paths provided by the first and second electrically-conductive layers, the level of coupling arranged to increase the mutual inductance within the power module.

20. The power module of claim 19, further comprising: a first power bar and a second power bar, wherein the first power bar and the second power bar are respectively connectable to the first and second electrically-conductive layers through respective electromechanical interfaces arranged at selectable interface locations along the first and second electrically-conductive layers.

21. The power module of claim 18, further comprising: a first power bar and a second power bar, wherein the first power bar and the second power bar are respectively connectable to the first and second electrically-conductive layers through respective electromechanical interfaces arranged at selectable interface locations along the first and second electrically-conductive layers.

\* \* \* \* \*